United States Patent [19]

Blake

[11] Patent Number: 4,623,989

[45] Date of Patent: Nov. 18, 1986

[54] MEMORY WITH P-CHANNEL CELL ACCESS TRANSISTORS

[75] Inventor: Terence G. Blake, Dallas, Tex.

[73] Assignee: Texas Instruments Incorporated, Dallas, Tex.

[21] Appl. No.: 528,204

[22] Filed: Aug. 31, 1983

[51] Int. Cl.$^4$ .................... G11C 11/40; G11C 8/00
[52] U.S. Cl. .................................... 365/156; 365/190; 365/230
[58] Field of Search ............... 365/190, 156, 154, 181, 365/230; 307/449, 463

[56] References Cited

U.S. PATENT DOCUMENTS

| Re. 28,905 | 7/1976 | Hodges | 365/190 |
|---|---|---|---|
| 4,132,904 | 1/1979 | Harari | 365/156 |
| 4,253,162 | 2/1981 | Hollingsworth | 365/156 |
| 4,366,560 | 12/1982 | McDermott et al. | 365/154 |
| 4,367,538 | 1/1983 | Shimada | 365/230 |
| 4,418,402 | 11/1983 | Heagerty et al. | 365/156 |
| 4,467,451 | 8/1984 | Moyer | 365/156 |
| 4,507,759 | 3/1985 | Yasui et al. | 365/208 |

OTHER PUBLICATIONS

Stewart et al, "A 40 ns CMOS E$^2$PROM", IEEE ISSCC, Feb. 11, 1982, pp. 110–111.
Kang et al, "A 30 ns 16K×1 Fully Static RAM", IEEE Journal of Solid State Circuits, vol. 16, No. 5, Oct. 1981, pp. 444–448.
Rhodes et al, "A 20 ns, Low Power, 1K×4 Static RAM", IEEE Journal of Solid State Circuits, vol. 16, No. 5, Oct. 1981, pp. 594–597.

*Primary Examiner*—James W. Moffitt
*Assistant Examiner*—Glenn A. Gossage
*Attorney, Agent, or Firm*—Douglas A. Sorensen; Robert O. Groover, Jr.; Melvin Sharp

[57] ABSTRACT

A static random access memory wherein all cells have p-channel access transistors, p-channel driver transistors, and n-channel loads. The access transistors have a width to length ratio which is greater than the width to length ratio of the driver transistors.

The bit lines are precharged close to VSS, and the wordlines are held near VCC in the off state. Thus the operating signals in the array of the SRAM of the present invention are opposite to those in SRAMs of the prior art.

7 Claims, 7 Drawing Figures

MEMORY WITH P-CHANNEL CELL ACCESS TRANSISTORS

BACKGROUND AND SUMMARY OF THE INVENTION

The present invention relates to semiconductor static random access memories (SRAMs).

The key desiderata driving SRAM art are speed, density, and power dissipation.

One effective way to improve power dissipation, at little cost in speed or density, has been found to be CMOS processing wherein both n-channel and p-channel active devices are available.

Fabrication constraints for a scaled CMOS process are based on cost related issues, which dictate the minimization of processing steps. Recent studies in CMOS fabrication techniques for 1 micron-2 micron geometry CMOS, have focussed on reduction of latch up sensitivity, and on optimization of the higher gain n-channel transistor for maximum performance.

These issues have led to the development of the "reverse CMOS" or twin-tub process in which a p+/p-type epi substrate is used to fabricate NMOS circuits, with a n-type tank in which the p-channel transistors are fabricated.

MOS static RAMs conventionally are based on 6T cells in which the pass transistors, gated by the word lines, and the active drive transistors are all N-channel. Typically, the loads have been high-resistance polysilicon resistors or, in NMOS, depletion devices; that is, they have been high-impedance devices, designed to conduct little current from the high node of the cell, in order to limit power consumption, while still being able to at least hold up the high side of the cell.

In CMOS RAMs, the load devices have been P-channel enhancement transistors, which turn off on the low side of the cell because their gates are connected to the high node. This reduces standby power considerably. However, when they turn on they hold the high node strongly high. Then they have relatively low impedance even though their widths are minimum and even though their carrier mobility is only about one third that of N-channel devices. Thus, the CMOS cell is not easily disturbed when read by a pair of bit lines initially carrying the opposite potential difference from the previous cycle, nor is the high node so susceptible to being discharged by mobile charge from the tracks of alpha-particles. Also, it does not have excessive standby current at higher temperatures, as may a depletion-load cell whose device Vto's all fall with increasing temperature.

A cell, selected for read by turning on the word line pass transistors, should not have its low node pulled high by a bit line which is constantly precharged high, to a Vt below Vcc; if its other node is pulled high much less strongly because its bit line is low from a previous read or write, the cell could switch. Writing to the cell involves pulling one bit line low; when the pass transistors are on, the corresponding node is pulled low, resisted only by the weak P-channel load device, turning on the other P-channel driver device and switching the cell.

Thus, although such a CMOS 6T cell may be more complex and larger than an NMOS cell, due to the P-type mask with its boundary region, the P-channel load represents an improvement in stability of data retention at N-channel devices as drivers and word-select transistors, so it is not surprising that this is the CMOS cell that has been generally adopted for existing static RAMs.

It is an object of the present invention to provide a static random access memory cell having fast read, fast write, immunity to read and good resistance to alpha-particle induced error. It is a further object of the invention to provide a cell having these advantages which is sensitive to process variations. It is a further object of the invention to provide a cell having these advantages and low power dissipation too.

As taught by the present invention, the other true CMOS 6T cell, which would have N-channel loads and four P-channel transistors, turns out to have unexpected advantages. In this case, the P-channel drive transistors pull up, the bit lines are constantly precharged to a Vt above the lower rail, and the cell is written by pulling one bit line up.

Published P-load cells (four n-channel devices) all seem to have similar device sizes as estimated from micrographs. We may assume that the P-channel conduction factor K' is roughly ¼ of the N-channel K', neglect the effects of different P+ and N+ source-/drain resistances, and define the Beta of a cell to be the ratio of the betas (beta=K' W/L) of the drive and pass transistors. For a PMOS cell having a subthreshold-current-leakage load transistor (which is a passive device somewhat like a resistor), the optimum sizes give a similar result for Beta (the pertinent parameter of the subthreshold load device is its resistance, here 300 Meg-Ohms):

1.5-3 micron bulk CMOS PMOS subthreshold-load cell:

Beta=((4/1.5)/(3/2))=1.8.
Load/Pass=((3/2.5)/(3/2))=0.8.
Drive/Load=((4/1.5)/(3/2.5))=2.2.

This scheme requires that the BIT and $\overline{BIT}$ lines be precharged near Vss, and that the p-channel pass transistors be turned off if the wordline is held at Vcc nominally. The nominal condition of storage is thus just the opposite of what is used in current art with n-channel pass devices.

According to the present invention there is provided:

A static random access memory comprising:

an array of memory cells arranged in rows and columns, each memory cell comprising two access transistors, two driver transistors, and two load elements, wherein said access transistors and said driver transistors are p-channel field effect transistors;

a plurality of address decoder means, for selecting a particular one of said cells in said array for reading information out of or writing into; and sense amplifier means for amplifying the output signal provided by a particular one of said cells accessed by said address decoder means;

wherein said access transistors have a width-to-length ratio greater than the width-to-length ratio of said driver transistors.

BRIEF DESCRIPTION OF THE DRAWINGS

The present invention will be described with reference to the accompanying drawings, wherein.

DESCRIPTION OF THE PREFERRED EMBODIMENTS

Figure 1:
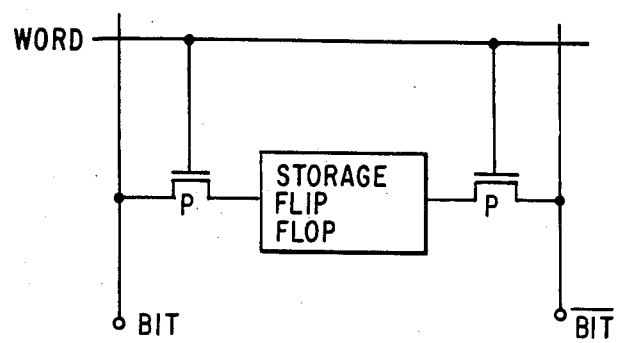
FIGS. 1 and 4A schematically show SRAM storage cells having p-channel access transistors.

The present invention as shown in FIGS. 1 and 1A teaches a static random access memory wherein all cells have p-channel access transistors 1 and 3, p-channel driver transistors 5 and 7, and (preferably) n-channel loads 9 and 11. Preferably the wordline decoder is configured as a pseudo-CMOS device, wherein one bit controls both pull up and pull down devices and the other bits control pull down devices only. This modification of a NOR decoder reduces the power consumed in the decoders by half without sacrificing speed.

The bit lines are precharged close to VSS, and the wordlines are held near VCC in the off state. The operating signals in the array of the SRAM of the present invention are *opposite* to those in SRAMs of the prior art.

The decoder of the presently preferred embodiment will first be described in detail and then the memory cell of the invention will be described. It should be noted that the row decoder is only required to pull down the selected word line and this can be accomplished with a wide variety of circuits.

The normal 1 of n decode circuit uses a n bit CMOS NOR logic for every wordline, so that only the logic gate with all '0' addresses is selected high, and all other combinations are held low. That is, each of the n bits to be decoded is provided both to the gate of a p-channel pull-up transistor and also to the gate of an n-channel pull-down transistor. The drains of the n pairs of transistors are all tied to a decoder output. The selected line provides a high '1' input to the decode driver, which normally is a non-inverting buffer/amplifier, and this drives the wordline high. In the non-selected decoders, current will flow from Vcc through the p-channel devices of "0" selected (low) address bits and through the n-channel devices of non-selected "1" (high) address bits to Vss. Thus, all non-selected devices dissipate power.

Figure 2:
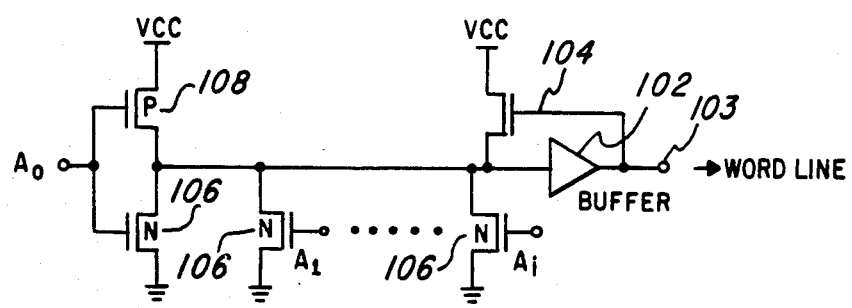
FIG. 2 shows the pseudo-CMOS wordline decoder used in the presently preferred embodiment.

The decode/drive scheme of the present invention is as follows:

The NOR logic is a pseudo-CMOS logic which has the addresses so arranged that the output is normally high. This pseudo-CMOS scheme is used because it drives only the input stage of the buffer and can afford to have the 5 to 1 p—to n— channel ratio, while saving the power in the NOR decoder. This scheme is shown in FIG. 2. The feedback from the buffer allows the decode speed to improve without increase in power dissipation.

Figure 3:
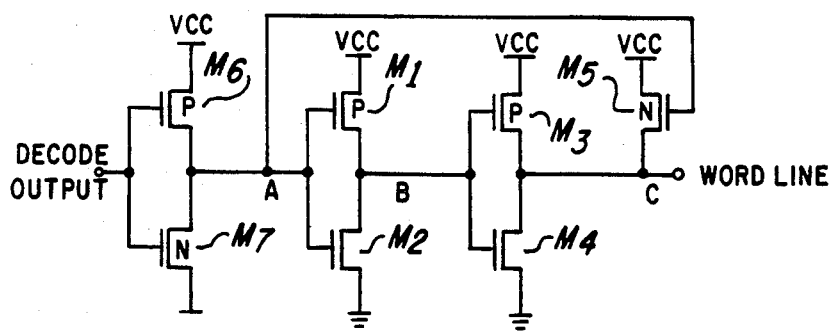
FIG. 3 shows the buffer used at the output of the decoder of FIG. 2, in one embodiment, incorporating feedback within the driver to speed up the driver's pull-up speed.

In the deselected mode all addresses are high so that the output is high. The decode driver is an inverting buffer, which is a unique circuit configuration as shown in FIG. 3.

This driver circuit works as follows. When the chip is deselected the input to the driver is low. This causes B to be low. Thus M4 is off and both M3 and M5 are on, pulling up node c to Vcc. The parallel combination of M3 and M5 form the key pull up element which allows the node c to be pulled up very rapidly when the input A changes from low to high.

Initially, most of the pullup current is supplied by the n— channel high gain transistor M5. This begins one inverter delay before the corresponding pull down. as c approaches a Vtn below Vcc, the n-channel device M5 turns off and the p— channel device M3 pulls up node c all the way to the rail. Since the major portion of the rise time is limited by M5, the pull up and pull down times can be reasonably matched without an excessively large W/L p-channel pull up device. This reduces the drive requirement on M1 and allows the overall rise time to be of the same order as the pull down time. It is important to note that the pull down in this combination will be very efficient since the high-gain n— channel device M4 operates at full drive in this mode. We use this efficient pull down to select the wordline, providing the highest speed access to the word line in this technology. The addition of M5 guarantees that in continuous static operation where different word lines are selected in consecutive read cycles, there is no disturb due to a significantly longer deselect time. Note that the pass transistors in the deselected lines must be at or near turn off in order to cut off of the cell read in the previous state. The presence of M5 allows the deselected line to be pulled up an inverter delay before M4 of the newly selected wordline starts pulling down. This guarantees that the selected and deselected wordlines cross at a voltage close to the p-channel pass transistor threshold, so that no disturb problems can occur.

Figure 4A:
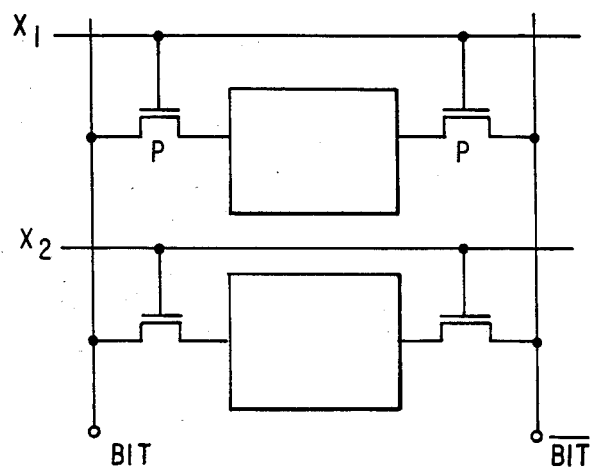
Figure 4B:
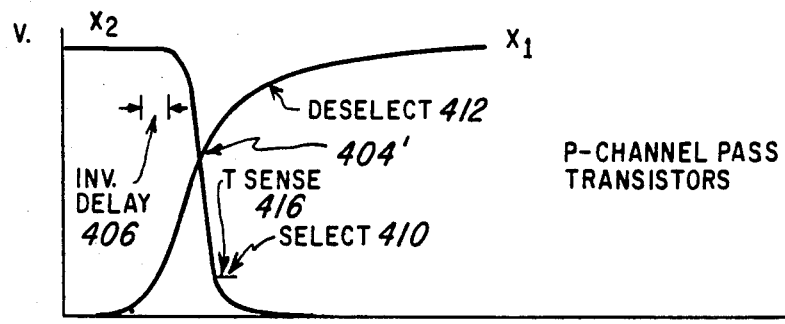
FIGS. 4B and 4C show waveforms indicating select and deselect times achieved with the decoder of the present invention.
Figure 4C:
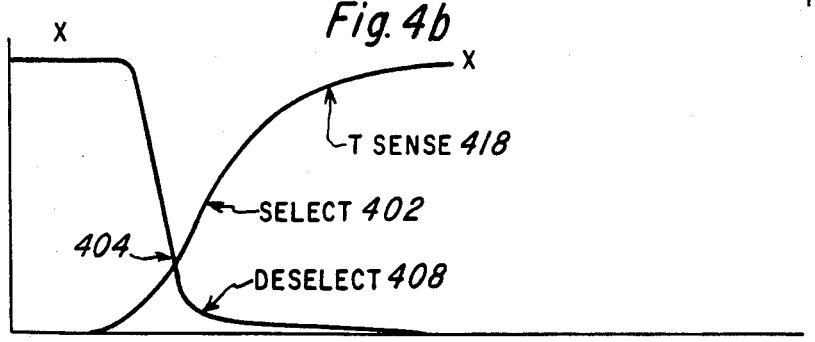

If the normal way of addressing the cell with n-channel devices was used, it would be necessary to let the wordlines cross near Vss, thus requiring a larger select time. This is illustrated in FIG. 4 and may be understood as follows. For n— channel pass transistors, the select point occurs when the wordline pulls up above Vtn. The deselect requirements are just opposite to that of the p-channel case, and the deselected wordline must be pulled down to below Vtn. This deselection is done via a pull-down n-channel transistor M4. M3 (and/or M5) must be made smaller to allow the crossover to occur near Vss rather than near Vcc as was the optimum case for the p-channel pass transistors. This means that the selected wordline is driven with less current and therefore must take longer to reach the turn on voltage required for optimum sensing. This extra time adds on to the access time and thereby slows down the memory.

Normal sensing operation in memory cells with n-channel transistors requires that the bit lines be precharged to a dc level close to Vcc, especially in high impedance cells. The high positive precharge of the bit line serves many purposes. It allows the perturbation from deselected wordlines to be minimized, provides a safe margin to the cell during the read, and takes full advantage of the pull down only capability of the cell. This approach for making CMOS memories (with arrays of NMOS high impedance-load cells) has been demonstrated by Hitachi in their 6147 SRAM.

The present invention preferably uses an array of cells each having p-channel pass transistors and p-channel drivers. The loads may be impedances (e.g., resistors), or p-channel transistors for improved density or n-channel resistors for reduced power dissipation. The advantages of this channel pass transistor have already been described. For this cell the bit line precharge requirements are opposite to that of the n— channel cell, viz the bit lines must be precharged to a voltage near Vss. Typically, the bit lines develop an analog signal about their precharge value, which is fed into an n-channel differential amplifier. (A p-channel differential amplifier would have low gain.) This differential amplifier must be biased within a Vtn of the bit line precharge level, to develop maximum gain. Thus, if the n-channel cell of the prior art is used, the sense signal is developed near Vcc and must be level shifted to near Vss in order to drive subsequent logic circuits, e.g., an output buffer driver. This level shifting is typically done in two or three stages and requires additional time, which increases the total access time of the memory.

Figure 5:
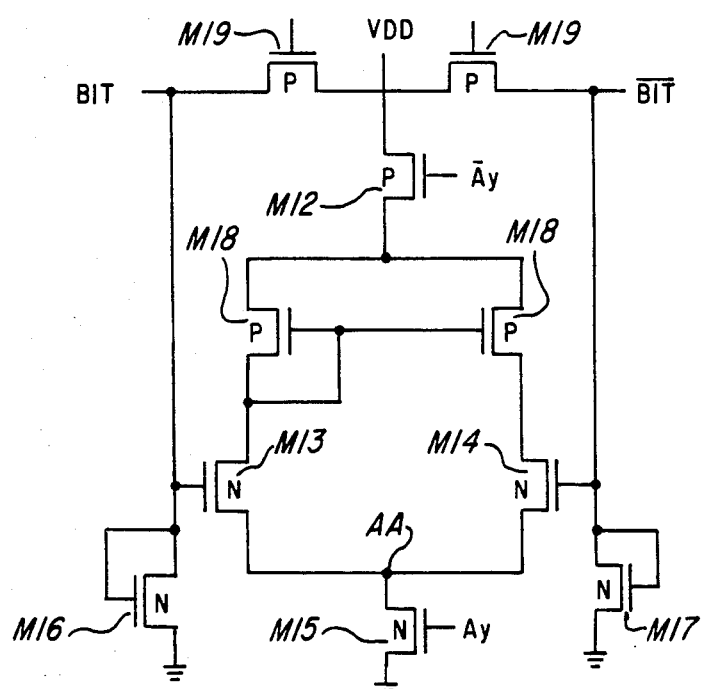
FIG. 5 shows the sense amplifier preferably used in a further embodiment of the present invention.

In the p— channel cell, the bit lines are precharged near Vss, so that the signal may be fed directly to a differential n— channel amplifier with p— channel loads biased near Vss, as shown in FIG. 5.

The preamp can be powered down via the column select Ay signals using transistors M12 and/or M15, which even at full drive will provide a small current if the W/L is small. Since the loads M18 are essentially constanht current sources in the active mode, this circuit is very similar to the n-channel sense amplifier with depletion loads used in NMOS SRAMS, except for the fact the node AA is biased near ground. M5 is a very small n-channel device which is optional: it may serve to improve the gain of the amplifier by limiting the total current through M13 and M14. Ideally the bit lines should be biased slightly below, or just at Vtn so that the signal from the cell cuts off one of M13 or M14 and turns on the other, to provide a large diffential gain. The signal on the output of this preamplifier needs no further level shifting and may directly be fed to the output buffer, thus reducing the delay in the sensing phase.

The memory cells of the presently preferred embodiment of the present invention are configured as follows:

CMOS cells with N-channel loads according to the present invention have optimal device sizes that are similar with respect to each other but noticeably different from the prior art CMOS or PMOS cells (K' values shown in units of microAmp per square Volt):

1.5–3 micron bulk CMOS p-driver N-load cell:
  Beta=((9.72(K')×3(microns driver width)/1.5 (microns driver length))/(9.72(K')×3.75/1.5) pass transistor W/L)))=0.8.
  Load/-
    Pass=((44.8×3/2.75)/(9.72×3.75/1.5))=2.01.
  Drive/Load=((9.72×3/1.5)/(44.8×3/2.75))=0.4.

In a further embodiment of the invention, an SOI embodiment of an N-load, P-driver, P-access cell has been simulated:
SOI CMOS cell:
  Beta=((6.4×3.75/2.5)/(6.4×5/2.5))=0.75.
  Load/Pass=((27.6×3.75/3.75)/(6.4×5/2.5))=2.16.
  Drive/-
    Load=((6.4×3.75/2.5)/(27.6×3.75/3.75))=0.35.

These illustrative embodiments of the present invention are provided merely as examples, and are assumed to be embodied using physical parameters as follows:

For the bulk CMOS cell, using a 3 volt supply, the gate oxide thickness is 250 Angstroms and the n-channel devices are placed in a p-well 2¼ microns deep and having a surface doping of $6\times10^{15}$ cm$^3$. The p-channel devices are placed in an n-tank 2½ microns deep, which has a surface doping level of $2\times10^{16}$ cm$^3$. Polysilicon, doped to 30 ohms per square, is used for the gate level. The n-channel threshold voltage is 0.77 volts and the p-channel threshold voltage is 0.68 volts.

For the silicon on insulator embodiment, a 5 volt supply is used, and a source/drain diffusions are driven all the way through the 0.55 micron thick silicon layer to the back side silicon dioxide layer (which itself is ½ micron thick). The channel doping profiles are: for p-type, $2.6\times10^{16}$ per cm$^3$, p-type at the surface, $5.3\times10^{15}$ at 0.1 micron depth, a junction at 0.12 microns, and n-type doping of $1\times10^{16}$ per cm$^3$ at 0.2 microns and $6\times10^{15}$ at 0.5 microns; for n-type: $1\times10^{16}$ at the surface and $2.3\times10^{16}$ at the back side. The gate oxide thickness is is 500 Angstroms, and the n-channel and p-channel threshold voltages are 0.7 volts. 30 ohms per square poly is used for the gates.

These circuits were optimized to extend the ranges of K' and Vto over which they could be written. They were never observed to have any inclination to switch during read, even though the cell upper nodes fall substantially from the rail; in the SOI cell for example, for some K' and Vto values the upper nodes drop 1.2 V from the rail (at Vcc=5 V).

A more detailed SPICE simulation was done of the performance of the cell and preamp in a Silicon-on-Insulator 4K sRAM design. The SOI 4K process is to have nominal parameters of the following values:
Nominal:
  P-channel: K'=6.4, Vto=0.7 V;
  N-channel: K'=27.6, Vto=0.7 V.
The simulated SOI 6T cell as optimized (above) could still be written when:
Case (1): P-ch, N-ch: K' 25% below nominal, Vto=1 V.
When the P-channel values were like case (1) but the N-channel current capability was increased:
Case (2):
  P-channel: K' 25% below nominal, Vto=1 V,
  N-channel: K' 10% above nominal, Vto=1 V,
writing was possible after the bit-line writing pull-up transistors were widened by 50%.

When the cell was modified to be more like the prior art N-channel driver cells, narrowing the pass transistor to 3.75 microns to increase the Beta to 1.0, the cell could not be written for case (1), because the ratio of load to pass device of 2.88 meant the low-potential node was held low more strongly. When the drive devices were widened to 5 microns giving a cell Beta of 1.33, the cell nodes still did not switch. The Beta=1.0 cell also could not be written for case (2), even when the N-channel K' was reduced to its nominal value and even with the 50% wider write devices.

Using the low-mobility P-channel devices for the drive and pass transistors may seem illogical to many designers. However, the N-channel-load cell of the present invention turns out to have several features that recommend it.

First, on the basis of SPICE simulations as indicated above, it is immune to spurious switching during read-after-read and read-after-write, for reasonable timing schemes, over ranges of values of K' and Vto wider than likely process-induced variations. It is correspondingly difficult to write, but the need for somewhat larger write transistors, (i.e., transistors M19 in FIG. 5) appears to be an acceptable drawback. In advanced bulk-CMOS technologies, the cell is also more resistant to upset due to charge generated by alpha particles because its four P-channel devices are protected by the reverse-biased junction between the N-well in which they usually reside and the P-type substrate.

Second, its optimal device sizes result, for given design rules, in a smaller cell. Conventionally, a static RAM cell design is optimized as follows. The pass transistor is made as narrow and short as allowed, and the drive transistor is made large enough to help the cell be written and to read its state through the pass transistors to the bit lines as fast as desired, while the load device is minimum width and long enough to permit the cell to switch when written. The difference in the design of the memory cell of the present invention is that the drive transistor is minimum width and the pass transistor may be larger. (There is usually some room to widen the pass transistors, as there is to lengthen the load transistors, without enlarging the cell, while widening the drive transistors will make the cell taller in typical layouts.)

Finally, although the active P-channel devices are low in carrier mobility and high in source-drain resistance, the read access time does not suffer. The N-channel load transistors, assisted by the N-channel bit-line pull-down precharge devices, can be much more active in pulling down a bit line which was high from the previous cycle, as compared to the rather passive P-channel loads (and P-channel pull-up precharge devices) for the conventional 6T cell. Also, since the bit lines are held to a Vt (+/− their small signal) above the lower rail, they can gate compact, high-conductivity N-channel devices in a high-gain sense amplifier. The sense amplifier can be a differential amplifier like that shown in FIG. 5, and no level-shifting stage is necessary.

Thus, the present invention provides numerous novel features and advantages, including 1. A 6-transistor static memory cell having P-channel pass transistors and drive transistors, and N-channel load transistors.
2. The bit lines are each precharged low by an N-channel device whose gate is connected to its bit line (or a P-channel device whose gate is grounded). (Thus, the 6T cell must pull them *up* during read, which is why its P-channel transistors are considered drive devices.)
3. The cell beta is less than unity, in contrast to conventional P-channel load cells. That is, where the driver and pass devices have the same K', the present invention teaches that the width-to-length ratio of each cell's driver devices should be less than that of its pass devices.
4. If P-channel transistors are in an N-type well (at Vcc) on a P-type substrate/epitaxial layer, they and therefore the cell are protected from charge generated from alpha particles by the reverse biased PN junction.
5. The sense amplifier is a differential-amplifier circuit in which
   the bit lines gate N-channel transistors. The bit line potentials equilibrate near the threshold of those N-channels. No level-shifting stage is necessary.
6. If the bit-line precharge devices are N-channel, the bit-line equilibration potential tracks the N-channel Vt across process and temperature variations.
7. A selected cell is written by merely pulling one bit line *high*.

As will be obvious to those skilled in the art, the present invention teaches fundamental innovations in static random access memories. The embodiments of the invention described above are certainly not limiting on the present invention, and can be widely modified and varied. The scope of the present invention is not limited except as set forth in the accompanying claims, which are to be construed broadly.

What is claimed is:

1. A static random access memory comprising:
   (a) An array of memory cells arranged in rows and columns, each memory cell comprising two p-channel field effect access transistors, two p-channel field effect driver transistors and two n-channel load transistors;
   (b) address decoder means for selecting a particular one of said cells in said array for reading information therefrom or writing infromation therein:
   (c) sense amplifier means for amplifying the information read from a particular one of said cells selected by said address decoder means;
   (d) said access transistors having a width-to-length ratio which is greater than the width-to-length ratio of said driver transistors in each said memory cell; and
   (e) a plurality of wordlines each connected to said address decoder means and to one row of said cells, whereby a selected one of said wordlines is pulled down to access one row of said cells;
   (f) at least one of said address decoder means comprising a NOR gate having a plurality of transistors, each transistor having a gate connected to one of said address bits, and wherein at least one of said address bits connected to each said NOR gate is connected to control both n-channel and p-channel transistors and at least one other of said address bits is connected to control only an n-channel transistor and not a p-channel transistor.

2. The memory of claim 1, wherein said sense amplifier comprises n-channel field-effect transistors connected to configure a differential amplifier,
   and means for precharging said bit lines to a potential which is close to ground.

3. The memory of claim 1, wherein said access transistors of all of said memory cells in each of said rows of said array is connected to a respective word line;
   and wherein said address decoder means pulls down one of said word lines corresponding to a selected memory cell and pulls up the others of said word lines.

4. The memory of claim 1, wherein said memory cells are arranged in rows and columns, and further comprising a pair of bit lines attached to each said respective pair of access transistors,
   and further comprising means for receiving first and second supply voltages at different potentials; and
   means for precharging said bit lines to a potential which is closer to the more negative of said first and second supply voltage potentials.

5. The memory of claim 4, wherein said precharging means comprises a plurality of n-channel transistors having a gate and a drain connected to one of said bit lines and also having a source connected to said more negative supply voltage.

6. The memory of claim 4,
   Further comprising a plurality of write transistors, each of said write transistors being connected between one of said bit lines and the less negative of said first and second supply voltage potentials.

7. The memory of claim 6, wherein said write transistors each comprise gates connected to write signals such that at most one of said write transistors is turned on to pull up only one of said bit lines,
   whereby an accessed one of said memory cells connected to said bit line which is pulled up by said write transistor can be written into.

* * * * *